United States Patent
Morikazu

(10) Patent No.: US 9,425,349 B2
(45) Date of Patent: *Aug. 23, 2016

(54) LIFT-OFF METHOD

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/612,732

(22) Filed: Feb. 3, 2015

(65) Prior Publication Data

US 2015/0221819 A1 Aug. 6, 2015

(30) Foreign Application Priority Data

Feb. 5, 2014 (JP) .................................. 2014-020126

(51) Int. Cl.
| | |
|---|---|
| *H01L 33/00* | (2010.01) |
| *B32B 37/00* | (2006.01) |
| *B32B 38/00* | (2006.01) |
| *B32B 38/10* | (2006.01) |
| *H01L 31/18* | (2006.01) |
| *B32B 37/18* | (2006.01) |
| *B32B 43/00* | (2006.01) |
| *H01L 21/78* | (2006.01) |

(Continued)

(52) U.S. Cl.
CPC ............ *H01L 33/0095* (2013.01); *B32B 38/10* (2013.01); *B32B 43/006* (2013.01); *H01L 31/186* (2013.01); *B32B 37/00* (2013.01); *B32B 2038/0044* (2013.01); *B32B 2305/00* (2013.01); *B32B 2323/00* (2013.01); *B32B 2457/14* (2013.01); *H01L 21/7806* (2013.01)

(58) Field of Classification Search
CPC .. B32B 2457/14; B32B 38/10; B32B 43/006; B32B 37/00; B32B 2323/00; B32B 2305/00; B32B 2038/0044; H01L 21/7806; H01L 31/186; H01L 33/0095
USPC ......................................................... 156/247
See application file for complete search history.

(56) References Cited

U.S. PATENT DOCUMENTS

| | | | |
|---|---|---|---|
| 2003/0087476 A1 | 5/2003 | Oohata et al. | |
| 2009/0053845 A1* | 2/2009 | Wong ..................... | B85Y 20/00 438/47 |
| 2012/0095584 A1* | 4/2012 | Ando ..................... | B32B 38/10 700/108 |

(Continued)

FOREIGN PATENT DOCUMENTS

| | | |
|---|---|---|
| JP | 2004-072052 | 3/2004 |
| JP | 2011093803 A * | 5/2011 |

OTHER PUBLICATIONS

U.S. Appl. No. 14/606,488, filed Jan. 27, 2015.

*Primary Examiner* — Philip Tucker
*Assistant Examiner* — Vicki Wu
(74) *Attorney, Agent, or Firm* — Greer Burns & Crain, Ltd.

(57) ABSTRACT

A lift-off method transfers an optical device layer of an optical device wafer onto a transfer substrate. The optical device layer is stacked on a front face of an epitaxy substrate with a buffer layer provided therebetween. A complex substrate formation step forms a complex substrate by joining the transfer substrate to a front face of the optical device layer of the optical device wafer with an adhesive. A buffer layer destruction step irradiates a laser beam at a wavelength that penetrates the epitaxy substrate and is absorbed by the buffer layer from a rear side of the epitaxy substrate of the complex substrate so as to destroy the buffer layer. An optical device layer transfer step peels off the epitaxy substrate and transfers the optical device layer onto the transfer substrate.

8 Claims, 8 Drawing Sheets

(56) References Cited

U.S. PATENT DOCUMENTS

2012/0168911 A1* 7/2012 Chen .................. H01L 21/3225
          257/615

2013/0017640 A1* 1/2013 Morikazu .............. B23K 26/00
          438/46
2013/0065010 A1* 3/2013 Hayashi .................... C30B 9/12
          428/76

* cited by examiner

LIFT-OFF METHOD

BACKGROUND OF THE INVENTION

1. Field of the Invention

The present invention relates to a lift-off method of transferring an optical device layer of an optical device wafer, which has the optical device layer stacked on the front face of an epitaxy substrate such as sapphire or SiC (silicon carbide) substrate with a buffer layer provided therebetween, onto a transfer substrate.

2. Description of the Related Art

In the optical device manufacturing process, an optical device wafer is formed by stacking an optical device layer on the front face of an approximately disk-shaped epitaxy substrate such as sapphire or SiC with a buffer layer provided therebetween. The optical device layer is made up of n- and p-type semiconductor layers made of GaN (gallium nitride), INGaP (indium-gallium-phosphorus), or ALGaN (aluminum-gallium nitride). An optical device wafer is formed by forming optical devices such as LEDs (light emitting diodes) or laser diodes in a plurality of areas partitioned by a plurality of streets formed in a grid pattern on the optical device layer. Then, the optical device wafer is divided along the streets, thus manufacturing individual optical devices.

Further, a manufacturing method called lift-off is disclosed in Japanese Patent Laid-Open No. 2004-72052 in order to ensure improved luminance or improved cooling of optical devices. The lift-off method transfers the optical device layer of an optical device wafer onto a transfer substrate such as molybdenum, copper, or silicon substrate. Lift-off is a technique of joining a transfer substrate to the side of the optical device layer of an optical device wafer with a joining metal layer such as AuSn (gold-tin), and irradiating a laser beam at a wavelength (e.g., 257 nm) that penetrates the epitaxy substrate and is absorbed by the buffer layer from the rear side of the epitaxy substrate so as to destroy the buffer layer, after which the epitaxy substrate is peeled off from the optical device layer, thus transferring the optical device layer onto a transfer substrate.

SUMMARY OF THE INVENTION

However, although irradiating a laser beam from the rear side of an epitaxy substrate by focusing the laser beam on the buffer layer destroys the buffer layer as a result of decomposition of GaN, INGaP, or AlGaN making up the buffer layer into Ga and $N_2$ gas, GaN, INGaP, or AlGaN decomposes into Ga and $N_2$ gas in some areas, but not in other areas. This results in irregular destruction of the buffer layer, thus making it impossible to peel off the epitaxy substrate properly.

Further, if the front face of the epitaxy substrate is uneven to provide improved quality of optical devices, the laser beam is blocked by walls caused by unevenness, thus suppressing the destruction of the buffer layer and making it difficult to peel off the epitaxy substrate.

In light of the foregoing, it is an object of the present invention to provide a lift-off method that can positively peel off an epitaxy substrate.

In accordance with an aspect of the present invention, there is provided a lift-off method of transferring an optical device layer of an optical device wafer, which has the optical device layer form ed on a front face of an epitaxy substrate with a buffer layer provided therebetween, onto a transfer substrate. The lift-off method includes a complex substrate formation step, a buffer layer destruction step, and an optical device layer transfer step. The complex substrate formation step forms a complex substrate by joining the transfer substrate to a front face of the optical device layer of the optical device wafer with an adhesive. The buffer layer destruction step irradiates a laser beam having a wavelength that penetrates the epitaxy substrate and is absorbed by the buffer layer from a rear side of the epitaxy substrate of the complex substrate so as to destroy the buffer layer. The optical device layer transfer step peels off the epitaxy substrate of the complex substrate that has been subjected to the buffer layer destruction step and transfers the optical device layer onto the transfer substrate. The optical device layer transfer step heats and cools the complex substrate to produce thermal distortion between the epitaxy substrate and the transfer substrate to which the optical device layer has been joined, thus destroying the buffer layer and peeling off the epitaxy substrate.

The complex substrate should preferably be heated to 100° C. or more and cooled to 20° C. or less in the optical device layer transfer step.

In the lift-off method according to the present invention, the optical device layer transfer step adapted to peel off the epitaxy substrate of the complex substrate that has been subjected to the buffer layer destruction step to transfer the optical device layer onto the transfer substrate heats and cools the complex substrate before peeling off the epitaxy substrate of the complex substrate to produce thermal distortion between the epitaxy substrate and the transfer substrate to which the optical device layer has been joined so as to destroy the buffer layer. Therefore, even the buffer layer that has been destroyed unevenly between different areas in the buffer layer destruction step is positively destroyed, thus making it possible to easily peel off the epitaxy substrate from the optical device layer. This eliminates degradation in optical device quality caused by destruction of the optical device layer as a result of peeling that has taken place where the buffer layer is not destroyed.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
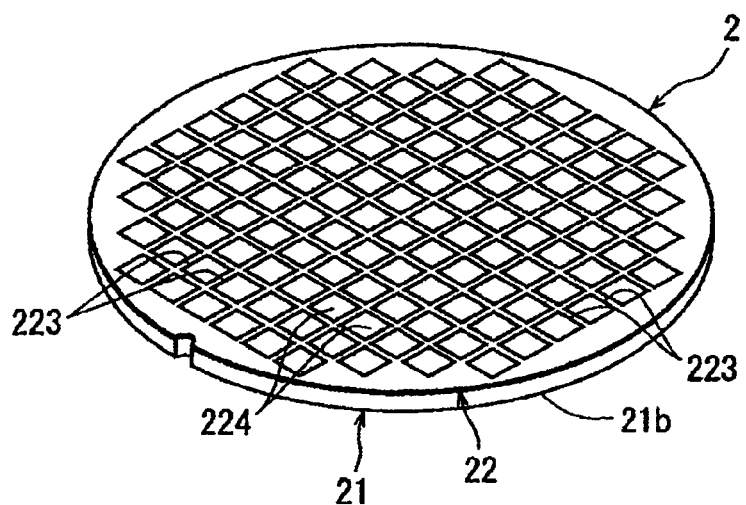
FIG. 1A is a perspective view of an optical device wafer having an optical device layer formed thereon which will be transferred onto a transfer substrate by a lift-off method according to the present invention.
Figure 1B:
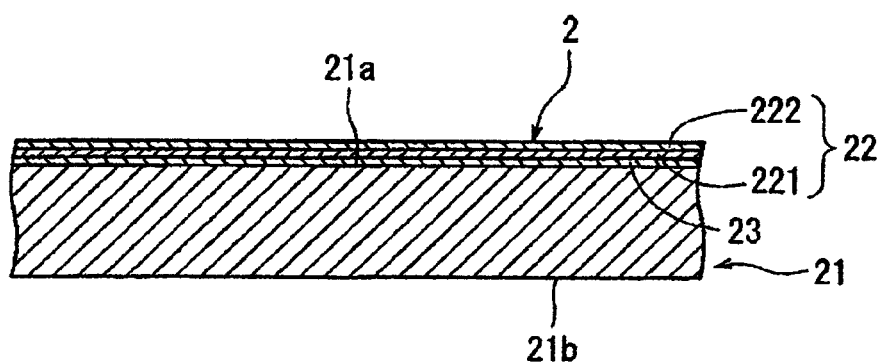
FIG. 1B is an enlarged cross-sectional view of major parts thereof.

A detailed description will be given below of a preferred embodiment of the lift-off method according to the present invention with reference to the accompanying drawings. FIG. 1A illustrates a perspective view of an optical device wafer having an optical device layer formed thereon which will be transferred onto a transfer substrate by the lift-off method according to the present invention. FIG. 1B illustrates an enlarged cross-sectional view of major parts of the optical device wafer.

An optical device wafer 2 shown in FIGS. 1A and 1B has an optical device layer 22 formed thereon by an epitaxial growth method. The optical device layer 22 is made up of an n-type gallium nitride semiconductor layer 221 and a p-type gallium nitride semiconductor layer 222. The gallium nitride semiconductor layers 221 and 222 are formed on a front face 21a of an epitaxy substrate 21. The epitaxy substrate 21 is a disk-shaped sapphire substrate of 50 mm in diameter and 600 μm in thickness. It is to be noted that when the optical device layer 22 made up of the n-type gallium nitride semiconductor layer 221 and the p-type gallium nitride semiconductor layer 222 is stacked on the front face 21a of the epitaxy substrate 21 by an epitaxial growth method, a buffer layer 23 of 1 μm in thickness, for example, is formed between the front face 21a of the epitaxy substrate 21 and the n-type gallium nitride semiconductor layer 221 making up the optical device layer 22. The buffer layer 23 is made, for example, of gallium nitride (GaN). The optical device wafer 2 configured as described above is formed in the present embodiment so that the optical device layer 22 is, for example, 10 μm in thickness. It is to be noted that the optical device layer 22 has optical devices 224 formed in a plurality of areas partitioned by a plurality of streets 223 as illustrated in FIG. 1A. The streets 223 are formed in a grid pattern.

Figure 2A:
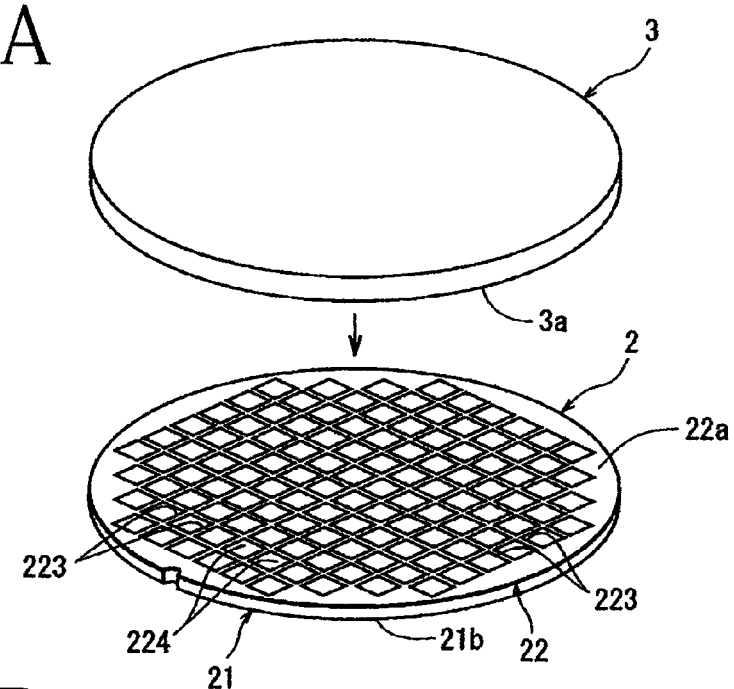
FIGS. 2A to 2C are explanatory diagrams of a complex substrate formation step.
Figure 2B:
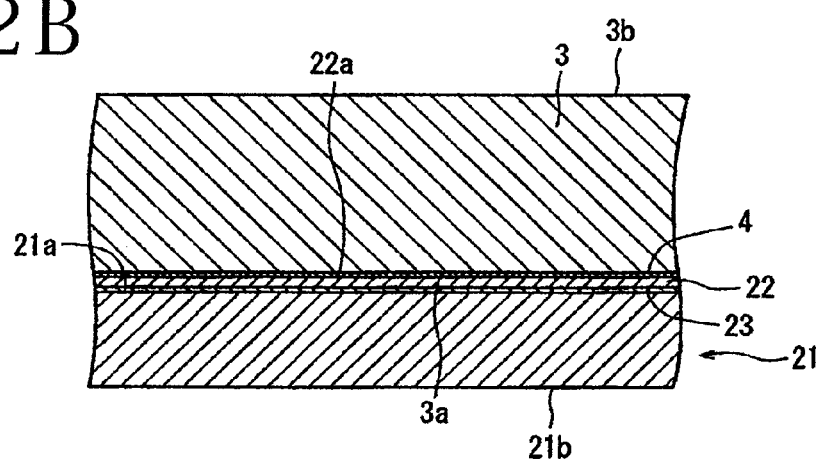
Figure 2C:
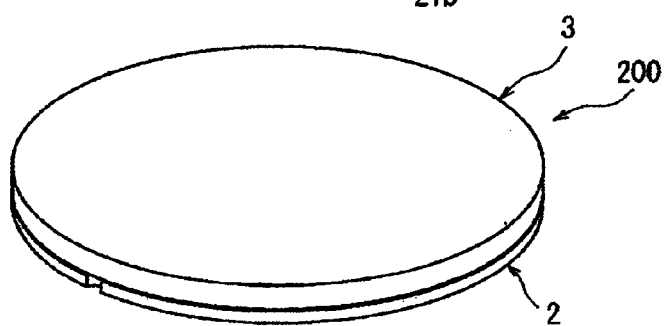

In order to peel off the epitaxy substrate 21 from the optical device layer 22 in the optical device wafer 2 and transfer the optical device layer 22 onto a transfer substrate, a complex substrate formation step is performed. In this step, a complex substrate is formed by joining the transfer substrate to a front face 22a of the optical device layer 22. That is, as illustrated in FIGS. 2A to 2C, a transfer substrate 3 is joined to the front face 22a of the optical device layer 22 with a joining metal layer 4 that is made of gold-tin (AuSn) and serves as a joining agent provided therebetween. The optical device layer 22 is formed on the front face 21a of the epitaxy substrate 21 making up the optical device wafer 2. The transfer substrate 3 is a copper substrate of 1 mm in thickness. It is to be noted that molybdenum (Mo), copper (Cu), or silicon (Si) can be, for example, used as the transfer substrate 3. On the other hand, gold (Au), platinum (Pt), chromium (Cr), indium (In), or palladium (Pd) can be, for example, used as a joining metal to form the joining metal layer 4. This complex substrate formation step forms the joining metal layer 4 of about 3 μm in thickness by vapor depositing the joining metal on the front face 22a of the optical device layer 22 formed on the front face 21a of the epitaxy substrate 21 or on a front face 3a of the transfer substrate 3, followed by crimping the joining metal layer 4 and the front face 3a of the transfer substrate 3 or the front face 22a of the optical device layer 22 together after arranging them so that they are opposed to each other, thus joining the front face 3a of the transfer substrate 3 to the front face 22a of the optical device layer 22 making up the optical device wafer 2 with the joining metal layer 4 provided therebetween and forming a complex substrate 200.

Figure 3:
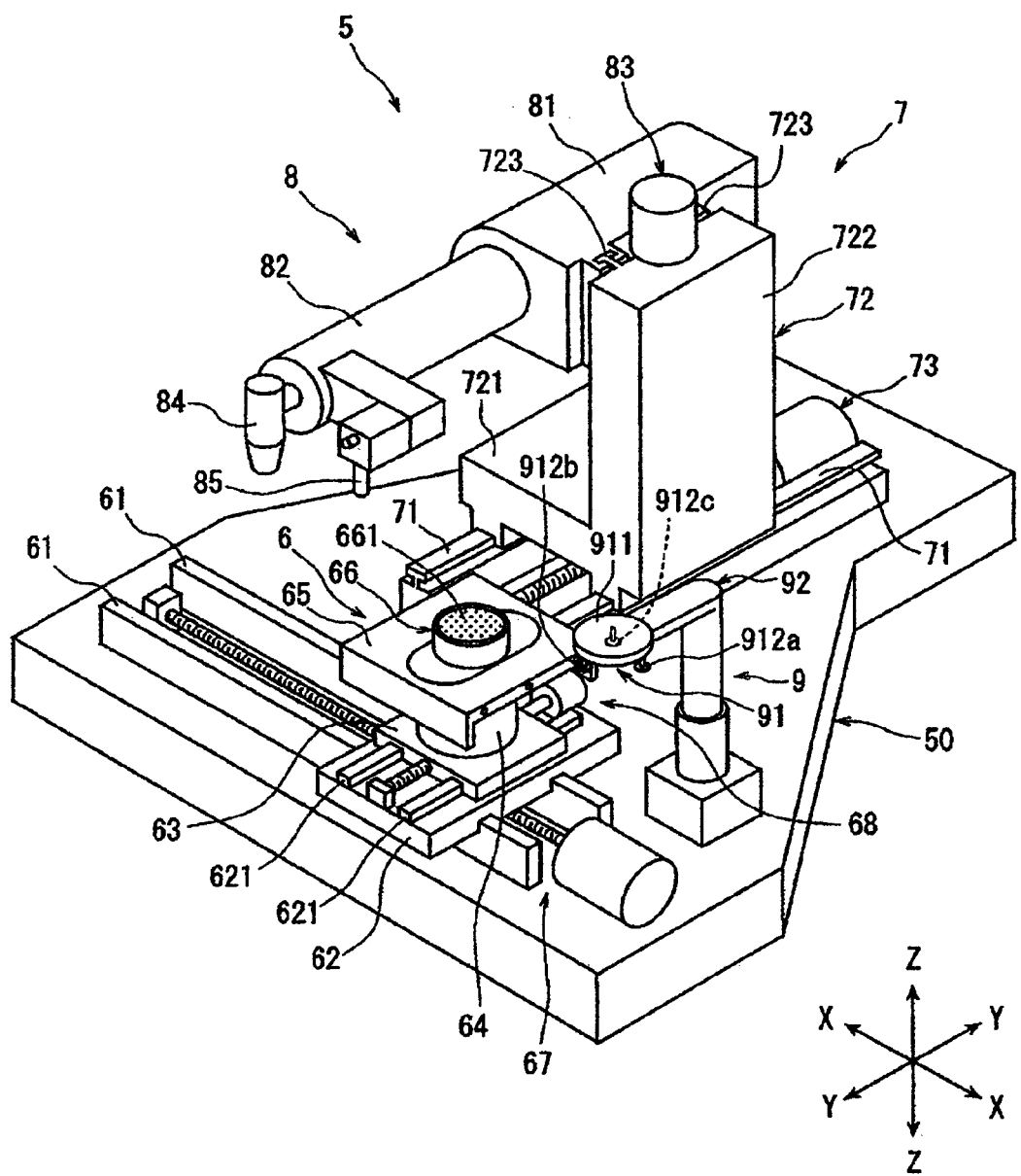
FIG. 3 is a perspective view of a laser machining apparatus adapted to handle a buffer layer destruction step and an optical device layer transfer step.

When the complex substrate 200 is formed by joining the front face 3a of the transfer substrate 3 to the front face 22a of the optical device layer 22 making up the optical device wafer 2 with the joining metal layer 4 as described above, a laser beam at a wavelength that penetrates the epitaxy substrate 21 and is absorbed by the buffer layer 23 is irradiated from the rear side of the epitaxy substrate 21 of the complex substrate 200, thus performing a buffer layer destruction step adapted to destroy the buffer layer 23. The buffer layer destruction step is performed using the laser machining apparatus shown in FIG. 3. A laser machining apparatus 5 shown in FIG. 3 includes a stationary base 50, a chuck table mechanism 6, a laser beam irradiation unit support mechanism 7, and laser beam irradiation means 8. The chuck table mechanism 6 is arranged on the stationary base 50 in a manner movable in a machining feed direction indicated by an arrow X (X-axis direction) to hold a workpiece. The laser beam irradiation unit support mechanism 7 is arranged on the stationary base 50 in a manner movable in an indexing feed direction (Y-axis direction) indicated by an arrow Y that is orthogonal to the X-axis direction. The laser beam irradiation means 8 is arranged on the laser beam irradiation unit support mechanism 7 in a manner movable in a focal position adjustment direction (Z-axis direction) indicated by an arrow Z.

The chuck table mechanism 6 includes guide rails 61, first and second sliding blocks 62 and 63, a cover table 65, and a chuck table 66. The guide rails 61 are arranged on the stationary base 50 to be parallel to each other along the X-axis direction. The first sliding block 62 is arranged on the guide rails 61 in a manner movable in the X-axis direction. The second sliding block 63 is arranged on guide rails 621 in a manner movable in the Y-axis direction. The guide rails 621 are arranged on the top face of the first sliding block 62. The cover table 65 is supported on the second sliding block 63 by a cylindrical member 64. The chuck table 66 serves as means to hold a workpiece. The chuck table 66 includes a suction chuck 661 that is formed with a porous material. For example, a disk-shaped semiconductor wafer, a workpiece, is held on the top face (holding face) of the suction chuck 661 by unshown sucking means. The chuck table 66 configured as described above is rotated by an unshown pulse motor that is arranged inside the cylindrical member 64. Further, the chuck table mechanism 6 shown in FIG. 3 includes machining feed means 67 and first indexing feed means 68. The machining feed means 67 moves the first sliding block 62 in the X-axis direction along the guide rails 61. The first indexing feed means 68 moves the second sliding block 63 in the Y-axis direction along the guide rails 621. It is to be noted that the machining feed means 67 and the first indexing feed means 68 include a known ball screw mechanism.

The laser beam irradiation unit support mechanism 7 includes a pair of guide rails 71 and a movable support base 72. The guide rails 71 are arranged on the stationary base 50 to be parallel to each other along the Y-axis direction. The movable support base 72 is arranged on the guide rails 71 in a manner movable in the Y-axis direction. The movable support base 72 includes a travel support section 721 and a fitted section 722. The travel support section 721 is arranged on the guide rails 71 in a manner capable of traveling. The fitted section 722 is attached to the travel support section 721. The movable support base 72 is moved by second indexing feed means 73 in the Y-axis direction along the guide rails 71. The second indexing feed means 73 includes a ball screw mechanism.

The laser beam irradiation means 8 includes a unit holder 81 and a casing 82. The casing 82 is attached to the unit holder 81. The unit holder 81 is supported in a manner capable of traveling in the Z-axis direction along guide rails 723 provided on the fitted section 722 of the movable support base 72. The unit holder 81 supported in a manner capable of traveling along the guide rails 723 is moved in the Z-axis direction by focal position adjustment means 83 that includes a ball screw mechanism.

The laser beam irradiation means 8 includes the cylindrical casing 82 that is fastened to the unit holder 81 and extends substantially horizontally. Unshown pulsed laser beam oscillation means is arranged inside the casing 82. The pulsed laser beam oscillation means includes a pulsed laser beam oscillator and repetition frequency setting means. A collector 84 is fitted to a tip portion of the casing 82 to collect the pulsed laser beam oscillated by the pulsed laser beam oscillation means. Imaging means 85 is arranged at a front end portion of the casing 82 to capture an image of the workpiece held by the chuck table 66 using the laser beam irradiation means 8. The imaging means 85 includes optical means such as microscope and CCD camera to transmit a captured image signal to unshown control means.

Figure 4:
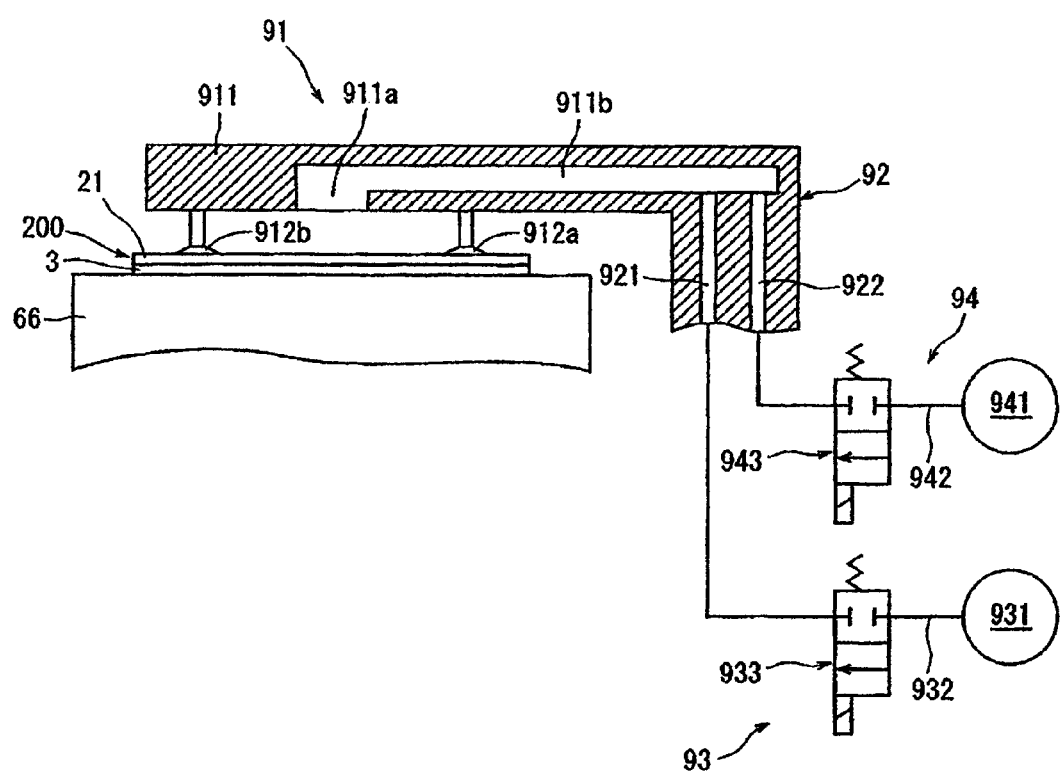
FIG. 4 is a cross-sectional view of major parts of a peeling mechanism incorporated in the laser machining apparatus shown in FIG. 3.

The laser machining apparatus 5 includes a peeling mechanism 9 adapted to peel off the epitaxy substrate 21 making up the optical device wafer 2 from the optical device layer 22. The peeling mechanism 9 includes suction means 91 and support means 92. The suction means 91 sucks the epitaxy substrate 21 with the optical device wafer 2 held by the chuck table 66 located at the peeling position. The support means 92 supports the suction means 91 in a manner capable of traveling vertically. The peeling mechanism 9 is arranged on one side of the chuck table mechanism 6. The suction means 91 includes a holding member 911 and a plurality of (three in the present embodiment) sucking pads 912a, 912b, and 912c attached on the lower side of the holding member 911. The sucking pads 912a, 912b, and 912c are connected to unshown sucking means. A fluid nozzle 911a and a communication passage 911b are formed in the holding member 911 as illustrated in FIG. 4. The fluid nozzle 911a is open on the bottom face of the holding member 911. The communication passage 911b communicates with the fluid nozzle 911a. Further, a heated air supply passage 921 and a cooled air supply passage 922 are formed in the support means 92. The heated air supply passage 921 and the cooled air supply passage 922 communicate with the communication passage 911b that is formed in the holding member 911. The heated air supply passage 921 is connected to heated air supply means 93, and the cooled air supply passage 922 is connected to cooled air supply means 94.

The heated air supply means 93 includes a heated air source 931, a pipe 932, and an electromagnetic switch valve 933. The pipe 932 connects the heated air source 931 and the heated air supply passage 921. The electromagnetic switch valve 933 is arranged in the pipe 932. Heated air is supplied from the heated air source 931 to the heated air supply passage 921 via the pipe 932 by opening the electromagnetic switch valve 933. It is to be noted that the temperature of heated air of the heated air source 931 should preferably be 100° C. or more. On the other hand, the cooled air supply means 94 includes a cooled air source 941, a pipe 942, and an electromagnetic switch valve 943. The pipe 942 connects the cooled air source 941 and the cooled air supply passage 922. The electromagnetic switch valve 943 is arranged in the pipe 942. Cooled air is supplied from the cooled air source 941 to the cooled air supply passage 922 via the pipe 942 by opening the electromagnetic switch valve 943. It is to be noted that the temperature of cooled air of the cooled air source 941 should preferably be 20° C. or less.

In order to perform the buffer layer destruction step adapted to irradiate a laser beam at a wavelength that penetrates the epitaxy substrate 21 and is absorbed by the buffer layer 23 from the rear side of the epitaxy substrate 21 of the complex substrate 200 so as to destroy the buffer layer 23 using the laser machining apparatus 5, the side of the transfer substrate 3 of the complex substrate 200 is placed on the top face of the chuck table 66. Then, the complex substrate 200 is sucked and held on the chuck table 66 by the unshown sucking means (wafer holding step). Therefore, the complex substrate 200 is held on the chuck table 66 so that a rear face 21b of the epitaxy substrate 21 making up the optical device wafer 2 faces up. When the complex substrate 200 is sucked and held on the chuck table 66 as described above, the machining feed means 67 is activated to move the chuck table 66 to the laser beam irradiation area where the collector 84 of the laser beam irradiation means 8 is located. Then, as illustrated in FIG. 5A, one end (left end in FIG. 5A) of the epitaxy substrate 21 making up the optical device wafer 2 of the complex substrate 200 held by the chuck table 66 is positioned immediately under the collector 84 of the laser beam irradiation means 8.

Figure 5A:
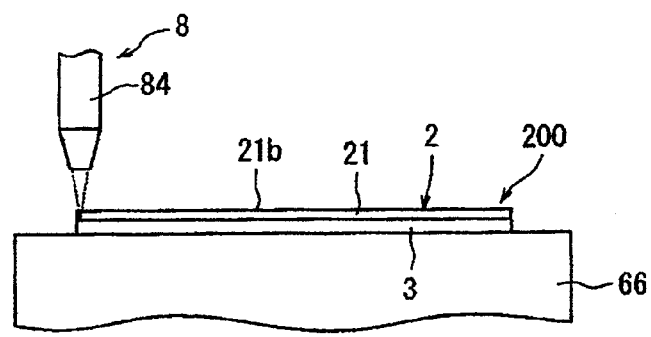
FIGS. 5A to 5C are explanatory diagrams of the buffer layer destruction step.
Figure 5B:
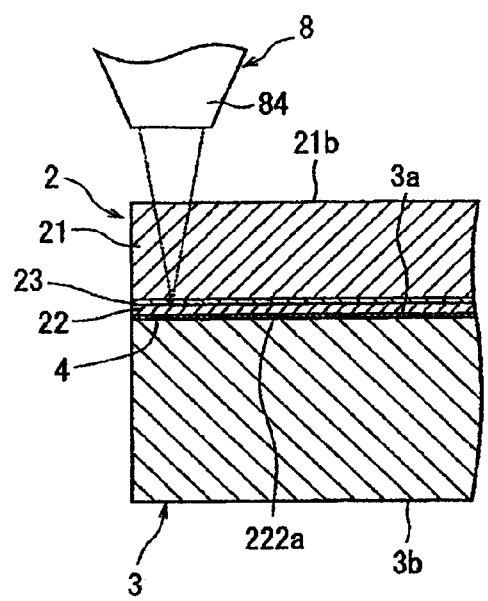
Figure 5C:
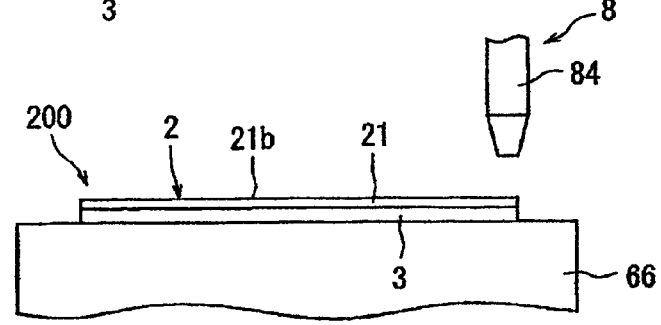

Next, the chuck table 66 is moved in the direction indicated by an arrow X1 in FIG. 5A at a predetermined machining feed rate while at the same time activating the laser beam irradiation means 8 and irradiating a laser beam at a wavelength that penetrates sapphire and is absorbed by the buffer layer 23 onto the buffer layer 23 from the collector 84. Then, as illustrated in FIG. 5C, when the other end (right end in FIG. 5C) of the epitaxy substrate 21 reaches the irradiation position of the collector 84 of the laser beam irradiation means 8, the irradiation of a pulsed laser beam is stopped, and the movement of the chuck table 66 is also stopped. This laser beam irradiation step is performed over the area that covers the entire surface of the buffer layer 23. It is to be noted that the buffer layer destruction step may be performed by positioning the collector 84 at the outermost perimeter of the epitaxy substrate 21 and moving the collector 84 toward the center while at the same time rotating the chuck table 66 so as to irradiate the entire surface of the buffer layer 23 with a pulsed laser beam.

The machining conditions of the buffer layer destruction step are specified as follows:
Light source: YAG laser
Wavelength: 257 nm
Repetition frequency: 50 kHz
Mean output: 0.12 W
Pulse width: 100 ns
Spot diameter: 70 μm
Defocus: 1.0 mm (Bring the collector 84 1 mm closer to the epitaxy substrate 21 with the laser beam focal point positioned on the rear face 21b of the epitaxy substrate 21)
Machining feed rate: 600 mm/sec Although the buffer layer 23 is destroyed by performing the buffer layer destruction step, it is difficult to destroy the entire buffer layer 23. As a result, the buffer layer 23 may be destroyed in some areas, but not in some other areas.

Figure 6A:
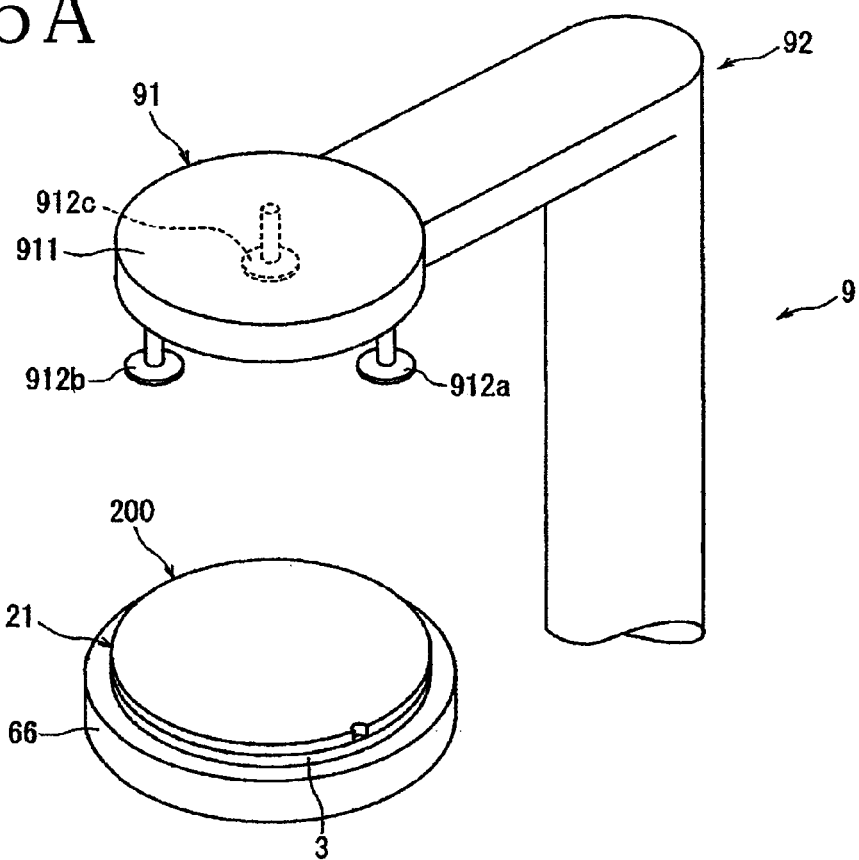
FIGS. 6A and 6B are explanatory diagrams of an epitaxy substrate suction step of the optical device layer transfer step.
Figure 6B:
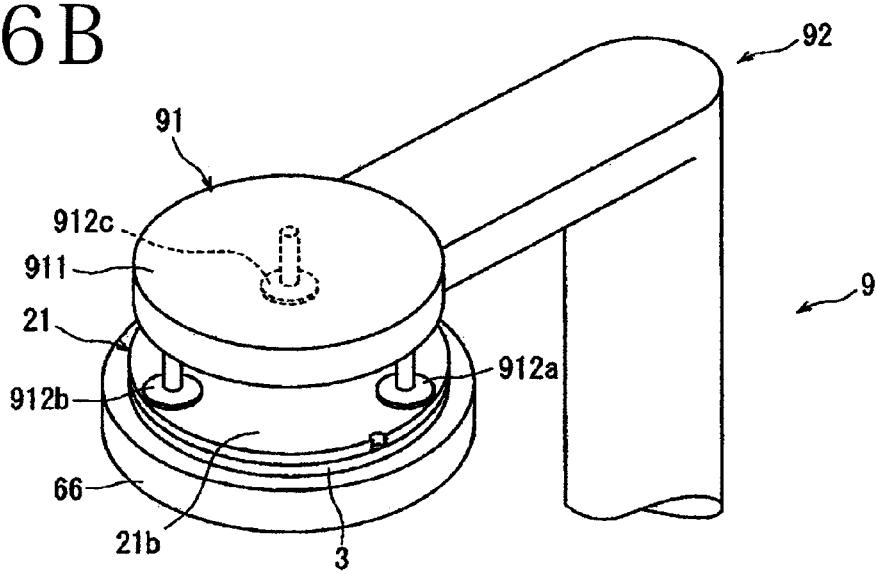

After the buffer layer destruction step, an optical device layer transfer step is performed to peel off the epitaxy substrate 21 of the complex substrate 200 and transfer the optical device layer 22 onto the transfer substrate 3. That is, the chuck table 66 is moved to the peeling position where the peeling mechanism 9 is arranged, and then the complex substrate 200 held by the chuck table 66 is positioned immediately under the suction means 91 as illustrated in FIG. 6A. Then, as illustrated in FIG. 6B, the suction means 91 is lowered to bring the sucking pads 912a, 912b, and 912c in contact with the rear face 21b of the epitaxy substrate 21, after which the unshown sucking means is activated to suck the rear face 21b of the epitaxy substrate 21 with the sucking pads 912a, 912b, and 912c (epitaxy substrate sucking step).

Figure 7A:
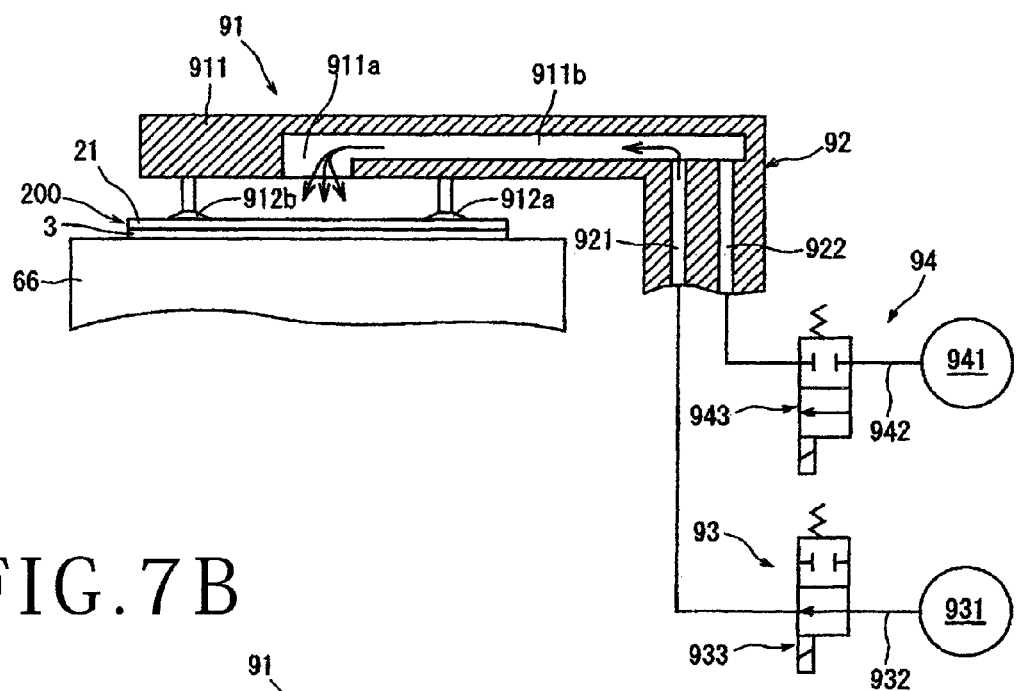
FIGS. 7A and 7B are explanatory diagrams of heating and cooling steps of the optical device layer transfer step.
Figure 7B:
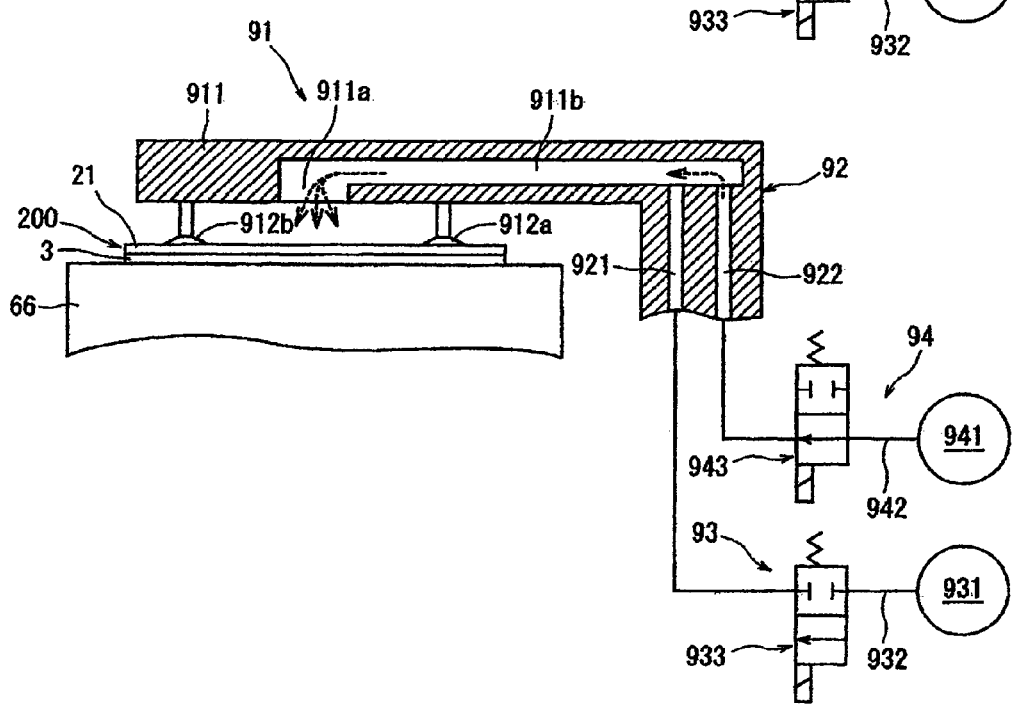

After the epitaxy substrate sucking step, the electromagnetic switch valve 933 of the heated air supply means 93 is opened as illustrated in FIG. 7A. Therefore, heated air of about 100° C., for example, is injected from the heated air source 931 onto the complex substrate 200 held by the chuck table 66 via the pipe 932, the heated air supply passage 921, the communication passage 911b, and the fluid nozzle 911a (heating step). It is to be noted that heated air need only be injected for ten seconds or so in the heating step. As a result, the complex substrate 200 is heated to a temperature in the neighborhood of 100° C. After the heating step performed as described above, the electromagnetic switch valve 933 of the heated air supply means 93 is closed, and the electromagnetic switch valve 943 of the cooled air supply means 94 is opened as illustrated in FIG. 7B. Therefore, cooled air of about 10° C., for example, is injected from the cooled air source 941 onto the complex substrate 200 that has been heated in the heating step via the pipe 942, the cooled air supply passage 922, the communication passage 911b, and the fluid nozzle 911a (cooling step). It is to be noted that cooled air need only be injected for ten seconds or so in the cooling step. As a result, the complex substrate 200 that has been heated to a temperature in the neighborhood of 100° C. in the heating step is cooled down to a temperature in the neighborhood of 10° C. As described above, heating and cooling the complex substrate 200 produces thermal distortion between the epitaxy substrate 21 and the transfer substrate 3 to which the optical device layer 22 has been joined, thus causing the buffer layer 23 to be destroyed. Therefore, even the buffer layer 23 that has been destroyed unevenly between different areas in the buffer layer destruction step is positively destroyed.

Figure 8:
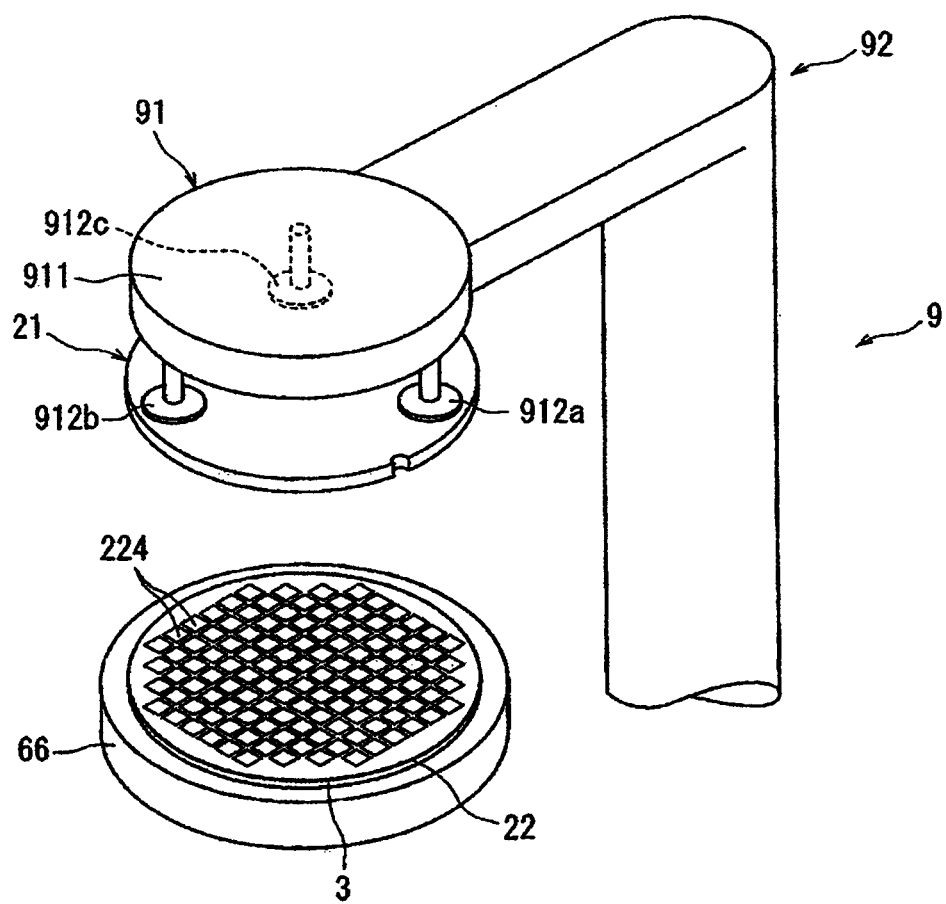
FIG. 8 is an explanatory diagram of a peeling step of the optical device layer transfer step.

After the heating and cooling steps described above, the peeling step is performed to move the sucking pads 912a, 912b, and 912c that have sucked the epitaxy substrate 21 away from the epitaxy substrate 21 so as to peel off the epitaxy substrate 21 and transfer the optical device layer 22 onto the transfer substrate 3. That is, after the cooling step shown in FIG. 7B, the electromagnetic switch valve 943 of the cooled air supply means 94 is closed. Then, the suction means 91 is raised as illustrated in FIG. 8, thus peeling off the epitaxy substrate 21 from the optical device layer 22. As a result, the optical device layer 22 is transferred onto the transfer substrate 3. The buffer layer 23 of the complex substrate 200 subjected to the peeling step has been positively destroyed thanks to not only the buffer layer destruction step but also the heating and cooling steps. This prevents the complex substrate 200 from being peeled in areas where the buffer layer 23 is not destroyed. This eliminates degradation in optical device quality caused by destruction of the optical device layer 22 as a result of peeling that has taken place where the buffer layer 23 is not destroyed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A lift-off method of transferring an optical device layer of an optical device wafer, which has the optical device layer formed on a front face of an epitaxy substrate with a buffer layer provided therebetween, onto a transfer substrate, the lift-off method comprising:
   a complex substrate formation step of forming a complex substrate by joining the transfer substrate to a front face of the optical device layer of the optical device wafer with an adhesive;
   a buffer layer destruction step of irradiating a laser beam having a wavelength that penetrates the epitaxy substrate and is absorbed by the buffer layer from a rear side of the epitaxy substrate of the complex substrate so as to destroy the buffer layer; and
   an optical device layer transfer step of peeling off the epitaxy substrate of the complex substrate that has been subjected to the buffer layer destruction step and transferring the optical device layer onto the transfer substrate,
   wherein the optical device layer transfer step heats and cools the complex substrate to produce thermal distortion between the epitaxy substrate and the transfer substrate to which the optical device layer has been joined so as to destroy the buffer layer and peel off the epitaxy substrate,
   wherein the complex substrate is heated to 100° C or more and cooled to 20° C. or less in the optical device layer transfer step, and
   wherein the heating and cooling of the complex substrate is performed by:
      injecting heated air upon the complex substrate via a fluid nozzle located in a holder member, and
      injecting cooled air upon the complex substrate via the fluid nozzle located in the holder member.

2. Then lift-off method of claim 1, wherein the holding member comprises:
   a plurality of sucking members for making contact with the complex substrate;
   a heated air supply passage in communication with a heated air source;
   a cooled air supply passage in communication with a cooled air source; and
   a communication passage that includes a first end in communication with the fluid nozzle and a second end in communication with both the heated air supply passage and the cooled air supply passage.

3. The lift-off method of claim 1, wherein:
   the step of injecting heated air is performed for about ten seconds; and
   the step of injecting cooled air is performed for about ten seconds.

4. The lift-off method of claim 2, wherein:
   the step of injecting heated air is performed for about ten seconds; and
   the step of injecting cooled air is performed for about ten seconds.

5. The lift-off method of claim 1, further comprising:
   opening a first electromagnetic switch valve to supply the heated air from a heated air source to the fluid nozzle; and
   opening a second electromagnetic switch valve to supply the cooled air from a cooled air source to the fluid nozzle.

6. The lift-off method of claim 2, further comprising:
   opening a first electromagnetic switch valve to supply the heated air from the heated air source to the heated air supply passage; and opening a second electromagnetic switch valve to supply the cooled air from the cooled air source to the cooled air supply passage.

7. The lift-off method of claim 1, further comprising a moving step of using the holding member to move a chuck table, with the complex substrate positioned thereon, from an irradiation position, where the buffer layer destruction step is performed, to a peeling position, where the optical device layer transfer step is performed.

8. The lift-off method of claim 7, wherein suction is applied through the holding member to adhere the complex substrate to the holding member during the moving step.

\* \* \* \* \*